United States Patent [19]
Saito et al.

[11] Patent Number: 6,097,600
[45] Date of Patent: Aug. 1, 2000

[54] ELECTRIC DEVICE

[75] Inventors: Yoshio Saito; Yoshikiyo Watanabe, both of Fukushima-ken; Nobuyuki Suzuki, Miyagi-ken, all of Japan

[73] Assignee: Alps Electric Co., Ltd., Tokyo, Japan

[21] Appl. No.: 09/231,716

[22] Filed: Jan. 15, 1999

[30] Foreign Application Priority Data

Jan. 23, 1998 [JP] Japan .................................. 10-010910

[51] Int. Cl.[7] ...................................................... H05K 7/20
[52] U.S. Cl. .......................... 361/704; 361/707; 361/710; 361/715; 361/721; 361/774; 257/713; 257/718; 174/16.3; 165/185
[58] Field of Search .................................... 361/704, 707, 361/761, 769, 709, 712, 713, 717, 812, 818, 719, 720, 774, 776; 257/707–727; 174/16.3, 52.4, 252; 165/80.2, 80.3, 185

[56] References Cited

U.S. PATENT DOCUMENTS 5,208,732  5/1993  Boudouin et al. ...................... 361/386

FOREIGN PATENT DOCUMENTS 5-160587A   6/1993   Japan .
9-326467A  12/1997   Japan .

Primary Examiner—Leo P. Picard
Assistant Examiner—Michael Datskovsky
Attorney, Agent, or Firm—Brinks Hofer Gilson & Lione

[57] ABSTRACT

In a box-shaped molded resin body having side walls and a flat plate part in which a heat discharging plate made of a metal is embedded, a part of the heat discharging plate is exposed from a through hole in the flat plate part and the side walls, and an electronic part mounted on a printed board assembled in the molded resin body is come into contact with the heat discharging plate exposed from the through hole, thereby discharging the heat generated from the electronic part by the heat discharging plate.

8 Claims, 3 Drawing Sheets

ELECTRIC DEVICE

BACKGROUND OF THE INVENTION

1. Field of the Invention

The present invention relates to an electronic device such as a transmitter/receiver unit housed in a portable telephone, in which heat discharge and weight reduction are considered.

2. Related Art

A portable telephone is required to be light, compact, and further, shock-resistant.

As shown in FIGS. 4 and 5, a conventional electronic device, for example, a transmitter/receiver unit for a portable telephone comprises a box-shaped frame member 52, an upper cover 53 covering the top face of the frame member 52, a lower cover 54 covering the under face of the frame member 52, and a printed board 51 housed in the frame member 52.

The transmitter/receiver unit is soldered to the main printed board of the body (not shown) by using metal terminals 56 which will be described later and constructs a portable telephone.

The frame member 52 has four side walls 52a formed by bending a solder-plated or tinned metal plate, openings 52b which are formed to be open upward and downward in the side walls 52a, and the metal terminals 56 used for both attachment and grounding extended integrally from the side walls 52 at the four corners of the side walls 52a.

A copper foil pattern (not shown) having high thermal conductivity is formed on the face of the rectangular-shaped printed board 51. The copper foil pattern is constructed by a land on which electronic parts 50 such as a power amplifier IC for transmission, a resistive element, a capacitor, and the like are soldered and a circuit pattern in which the electronic parts 50 are electrically connected. Further, a circuit pattern is formed for grounding around the printed board 51. The printed board 51 is housed so as to be fit almost in an intermediate position in the vertical direction of the inner faces of the side walls 52a of the frame member 52 and is electrically connected to the frame member 52.

The upper cover 53 is a solder-plated or tinned metal plate. The upper cover 53 has a notched and lowered part 55 formed by notching a part of a flat part 53a and bending it inside and a plurality of bent parts 53b formed by bending the periphery of the flat part 53a. The upper cover 53 is attached so as to cover the upper opening 52b of the frame member 52 and so that the inner sides of the bent parts 53b are fit on the outer faces of the side walls 52a.

The notched and lowered part 55 is arranged in a position to face from the above the electronic part 50, especially, the power amplifier IC for transmission on the printed board 51 assembled in the frame member 52. In this instance, the electronic part 50 is in contact with the notched and lowered part 55.

The lower cover 54 is made of the same material and has the same size as the upper cover 53. In the lower cover 54, a plurality of bent parts 54b are formed by bending the periphery of a flat part 54a in one direction. In a manner similar to the upper cover 53, the lower cover 54 is attached so as to cover the lower opening 52b of the frame member 52 and so that the inner sides of the bent parts 54c are fit on the outer faces of the side walls 52a.

Such a transmitter/receiver unit for a portable telephone discharges heat generated from the electronic parts 50, especially, from the power amplifier IC for transmission and the like to the outside by thermal conduction via the notched and lowered part 55 and the upper cover 53 connected to the notched and lowered part 55.

A conventional electronic device, especially, the transmitter/receiver unit for a portable telephone is constructed so as to discharge the heat generated by the electronic part from the cover via the notched and lowered part. Since the transmitter/receiver unit has a structure that it is covered with the metal frame member and upper and lower covers, although it has a heat discharging effect, there is a problem such that the unit is relatively heavy and it is difficult to reduce the weight.

SUMMARY OF THE INVENTION

In view of the above problem, it is an object of the invention to provide an electronic device having a casing structure which reduces the weight of the electronic device and produces a heat discharging effect.

A first solving means to achieve the object comprises: a resin molded body having side wall parts, a flat plate part, and one or more through holes formed in the flat plate part; a heat discharging member made of a metal embedded in the resin molded body in a state where a part of the heat discharging member is exposed to the through hole; and a printed wiring board on which an electronic part is mounted and which is attached to the flat plate part of the resin molded body. The electronic part mounted on the printed wiring board is inserted into the through hole and is come into contact with the heat discharging member made of a metal, thereby dissipating the heat of the electronic part to the metal heat discharging member.

A second solving means to achieve the object comprises:
- a resin molded body having side wall parts and a flat plate part;
- a heat discharging member made of a metal which has a projection part projecting from the flat plate part and is embedded in the resin molded body; and a printed wiring board on which an electronic part is mounted and which is attached to the flat plate part of the resin molded body, wherein the electronic part is come into contact with the projection part of the heat discharging member, thereby dissipating the heat of the electronic part to the heat discharging member.

According to a third solving means to achieve the object, the heat discharging member has a lattice part embedded in the flat plate part of the resin molded body and leg parts which are formed by bending the ends of the lattice part and are embedded in the side wall parts of the resin molded body.

According to a fourth solving means to achieve the object, the heat discharging member further comprises fixing parts extended from the leg parts and exposed to the outside of the resin molded body.

According to a fifth solving means to achieve the object, in the resin molded body, the flat plate part is plated with a metal film.

DETAILED DESCRIPTION OF THE PREFERRED EMBODIMENT

Figure 1:
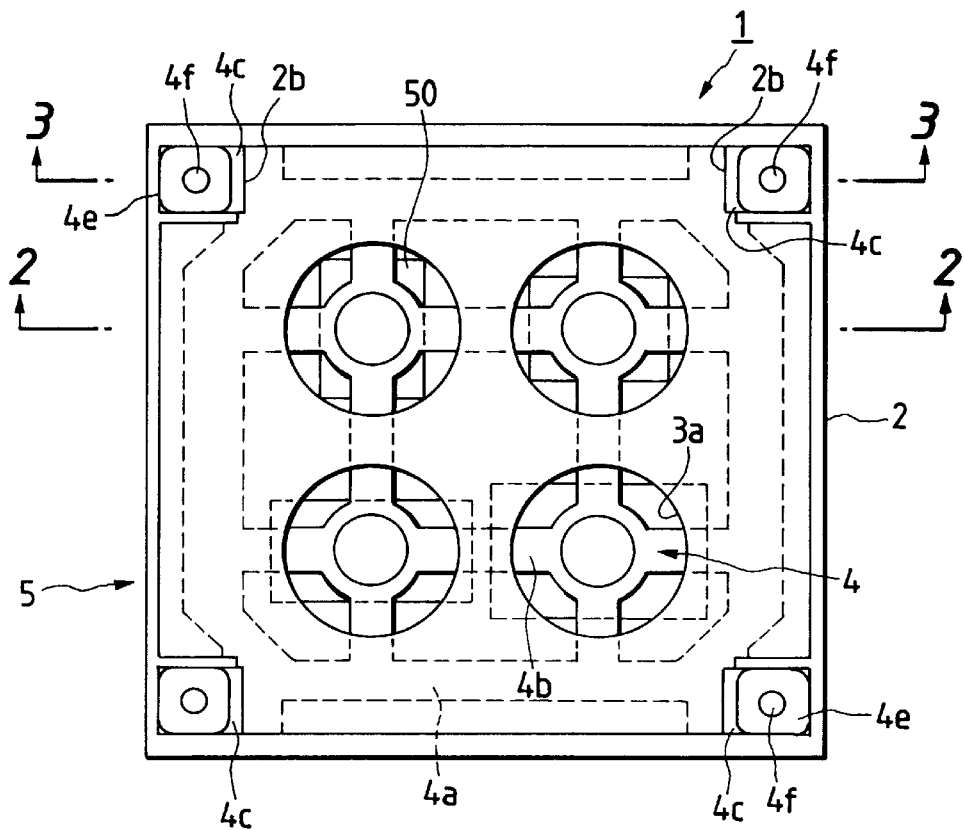
FIG. 1 is a plan view showing an electronic device of the invention.
Figure 2:
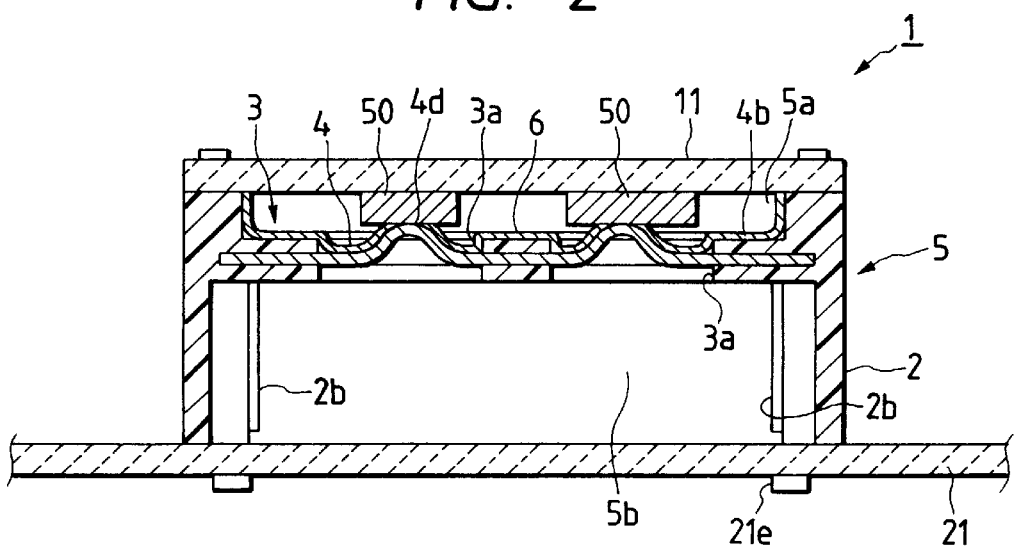
FIG. 2 is a cross section of the electronic device of the invention taken along the line 2—2 in FIG. 1.
Figure 3:
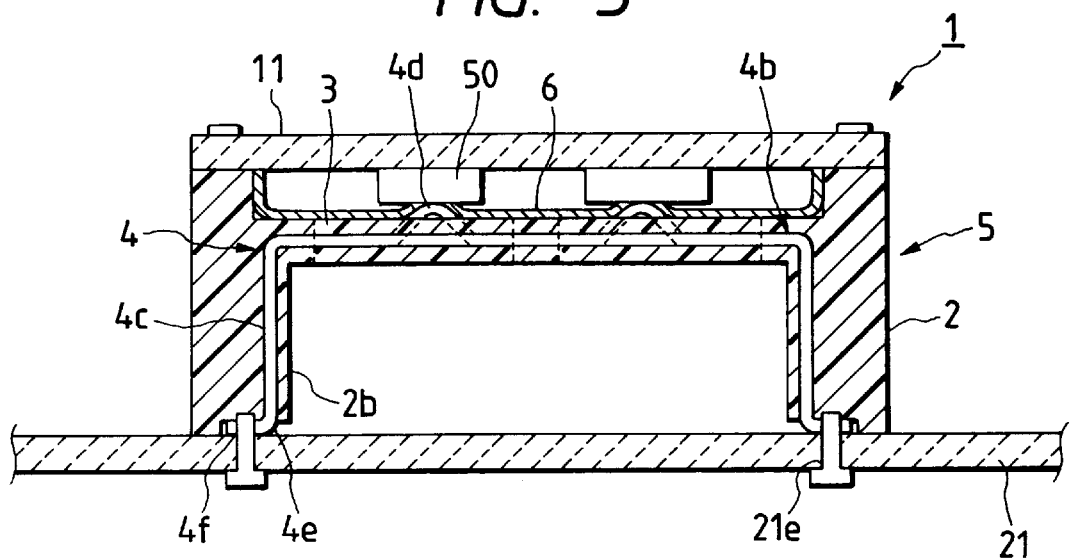
FIG. 3 is a cross section of the electronic device of the invention taken along the line 3—3 in FIG. 1.
Figure 4:
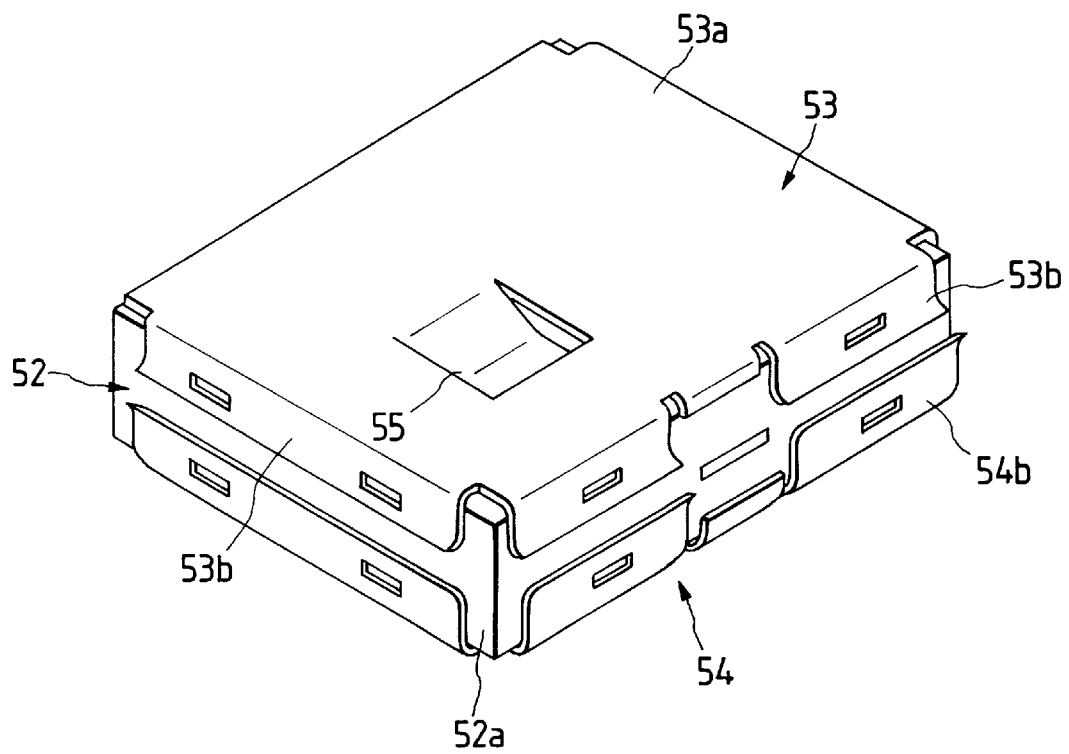
FIG. 4 is a perspective view of a conventional electronic device.
Figure 5:
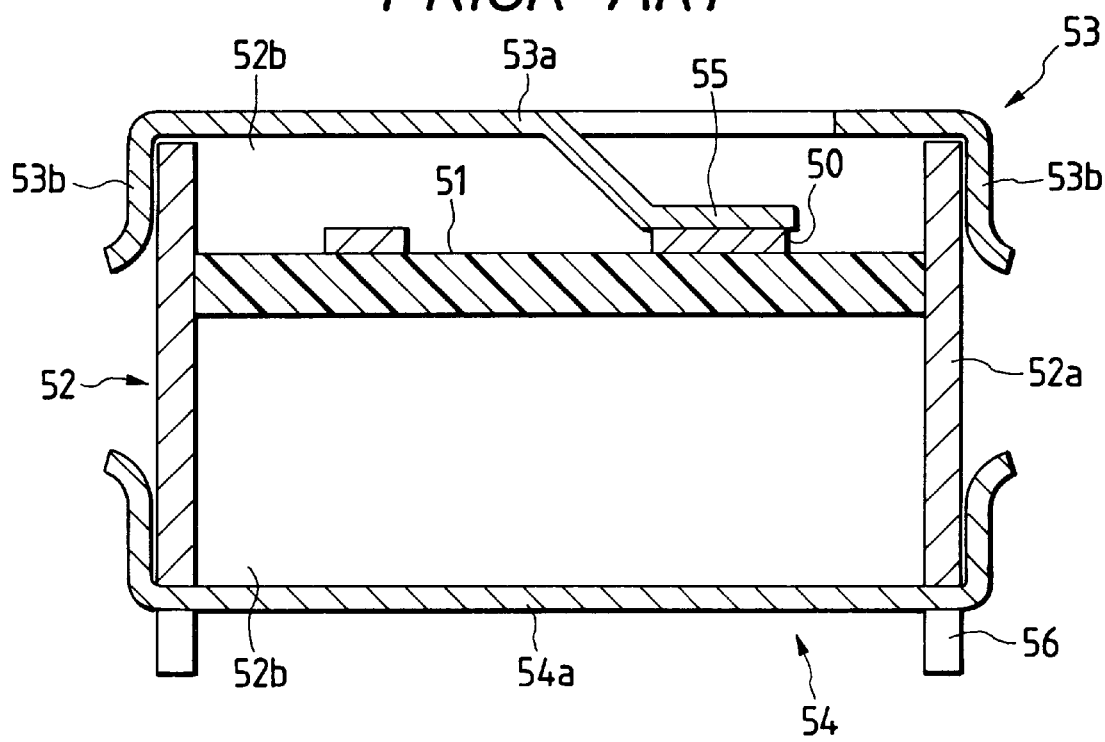
FIG. 5 is a cross section of the conventional electronic device.

A transmitter/receiver unit for a portable telephone as an electronic device of the invention will be described. FIG. 1 is a plan view of a transmitter/receiver unit for a portable telephone. FIG. 2 is a cross section taken along the line 2—2 in FIG. 1. FIG. 3 is a cross section taken along the line 3—3 in FIG. 1.

As shown in FIGS. 1 to 3, a transmitter/receiver unit 1 is constructed by a box-shaped molded resin body 5 and a printed board 11 provided on the molded resin body 5, and is mounted on a printed board 21 of the body of a portable telephone.

The molded resin body 5 is made of a heat-resisting mold resin material for insertion such as polypropylene. The molded resin body 5 has a pair of side walls 2 which are arranged to face each other and a flat plate part 3 which is arranged between the pair of side walls 2 so that the side walls 2 and the flat plate 3 form an H-letter shape in cross section. The flat plate part 3 is molded integrally with the side walls 2. The inside of the molded resin body 5 is partitioned by the flat plate part 3 into an upper space 5a and a lower space 5b. As will be described later, a heat discharging plate 4 made of a metal is embedded in the side walls 2 and the flat plate part 3.

At the four corners of the side walls 2 of the molded resin body 5, thick plate parts 2b which are thicker than the other part are formed. A plurality of mounting holes (not shown) are formed on the top and under faces of each thick plate part 2b.

In the flat plate part 3, a plurality of through holes 3a each having a circular shape are formed in the plate thickness direction, thereby communicating the upper and lower spaces 5a and 5b. A part of the heat discharging plate 4 embedded in the molded resin body 5 is exposed to each of the through holes 3a. Further, the surface of the flat plate part 3, the inner faces of the side walls 2, and the heat discharging plate 4 exposed to the through holes 3a which face the upper space 5a of the molded resin body 5 are coated with an electroless plating layer 6 which is obtained by nickel plating a copper underlayer, thereby obtaining significant magnetic shielding effect. Although not illustrated, the electroless plating layer 6 can be deposited also on the surface of the flat plate part 3 and the inner faces of the side walls 2 which face the lower space 5b of the molded resin body 5 so as not to exert a magnetic influence on the electronic parts on the main printed board 21.

The heat discharging plate 4 having an almost square shape is made of a metal material such as aluminium or copper and has a planar strip part 4b in which a plurality of strips 4a are crossed and connected in an almost lattice shape and four legs 4c formed by bending the four corners of the strip part 4b. The strip part 4b is embedded in the flat plate part 3 of the molded resin body 5 and the legs 4c are embedded in the thick plate parts 2b of the side walls 2.

Points where the strips 4a in the strip part 4b are crossed are exposed in a manner such that they are projected from the through holes 3a of the molded resin body 5 and serve as curved contact parts 4d each having a rounded top. The contact parts 4d are formed corresponding to positions in which the electronic parts 50 mounted on the printed board 11, especially, parts each having a large output and a large amount of heat generation such as the power amplifier IC for transmission are arranged.

The tips of the legs 4c of the heat discharging plate 4 are exposed from the under face of the thick plate parts 2b of the molded resin body 5. The tip of each leg 4c is bent almost at the right angle along the bottom face of the molded resin body 5, thereby forming a fixing part 4e. Further, the fixing part 4e has a hole 4f to be fixed by a fitting such as a screw in correspondence with the mounting hole of the thick plate part 2b.

On the square-shaped printed board 11, as mentioned above, the electronic parts 50 such as the power amplifier IC for transmission are soldered and a plurality of electronic parts 50 are electrically connected in a circuit pattern having high thermal conductivity. The circuit pattern is also used for grounding around the printed board 11.

The printed board 11 is fixed by inserting fittings such as screws into the mounting holes on the top faces of the thick plate parts 2b so that the face on which the electronic parts 50 are mounted faces the upper space 5a of the molded resin body 5. In this case, the electronic parts 50 such as the power amplifier IC for transmission having a large output and a large amount of heat generation are arranged so as to face the heat discharging plate 4 exposed from the through holes 3a of the flat plate part 3 of the molded resin body 5 and are in contact with the contact parts 4d of the heat discharging plate 4.

The transmitter/receiver unit 1 for a portable telephone constructed as above is assembled in the following manner. First, a hoop made of a metal is punched by a die and is bent, thereby forming the heat discharging plate 4. Next, the heat discharging plate 4 is insert molded with a molding resin, thereby forming the molded resin body 5. After forming the molded resin body 5, the fixing parts 4e are formed by bending the tips of the legs 4c of the heat discharging plate 4 which are exposed from the molded resin body 5.

Then, the printed board 11 is placed on the top faces of the side walls 2 so that the electronic parts 50 mounted on the printed board 11 are arranged in the upper space 5a of the molded resin body 5 and is fixed by inserting fittings such as screws into the mounting holes, thereby assembling the transmitter/receiver unit for a portable telephone. At the time of attachment, the electronic parts 50 mounted on the printed board 11 come into contact with the contact parts 4d. The thermal conductivity from the electronic parts 50 is secured by applying grease or the like between the electronic parts 50 and the contact parts 4d.

Finally, the transmitter/receiver unit is placed on the main printed board 21 and is fixed by inserting the fittings such as screws into the holes 4f of the fixing parts 4e, thereby constructing a portable telephone. Upon the attachment, the fixing parts 4e are fixed so as to be in contact with the copper foil pattern (earth pattern) of the main printed board 21.

In such a transmitter/receiver unit 1 for a portable telephone, the heat generated by the electronic parts 50 on the printed board 11 is conducted to the contact parts 4d which are in contact with the electronic parts 50 by thermal conduction, led from the leg parts 4c connected to the contact parts 4c to the circuit pattern (earth pattern) of the main printed board 21, and discharged to the outside. Thus, the temperature rise due to the heat generation of the electronic parts 50 can be suppressed. Since moderate strength is obtained by the heat discharging plate 4 without covering the body of the transmitter/receiver unit 1 with a metal member and the heat discharging plate 4 is formed in a lattice shape and embedded in the molding resin, the transmitter/receiver unit can be made light.

According to the electronic device of the present invention, in the molded resin body having the side walls and the flat plate part in which the heat discharging plate is embedded, the electronic parts mounted on the printed board are in contact with the heat discharging plate exposed from the through holes. Consequently, the heat generated by the electronic parts having a large amount of heat is effectively discharged, so that the temperature rise due to the heat generation of the electronic parts can be suppressed. Since the electronic device is constructed by the molded resin body, it can be made light.

By projecting the heat discharging plate from the through holes to the outside, the electronic parts which generate heat can easily and certainly come into contact with the heat discharging plate, so that the heat of the electronic parts can be discharged more effectively.

According to the electronic device of the present invention, since the heat discharging plate is made by the strip part in which a plurality of strips are connected in a lattice shape, the heat conduction from the contact parts which are in contact with the electronic parts can be secured. The heat can be discharged from any of the heat conductive paths to the outside, and the electronic device can be made lighter than the conventional one having the construction such that the whole device is covered with the upper and lower covers.

Since the legs have the fixing parts extended to the outside of the molded resin body, the molded resin body can be fixed to the main printed board by using the fittings, and the heat can be discharged more certainly.

By coating at least the inner face of the printed board in the molded resin body with the electroless plating, more sufficient magnetic shielding effect can be produced without providing a frame member made of a metal.

What is claimed is:

1. An electronic device comprising: a resin molded body having side wall parts, a flat plate part, and one or more through holes formed in the flat plate part; a heat discharging member made of a metal embedded in said resin molded body in a state where a part of the heat discharging member is exposed to said through hole; and a printed wiring board on which an electronic part is mounted and which is attached to the flat plate part of said resin molded body, wherein said electronic part mounted on said printed wiring board is inserted into said through hole and is come into contact with said heat discharging member.

2. The electronic device according to claim 1, wherein said heat discharging member has a lattice part embedded in the flat plate part of said resin molded body and leg parts which are formed by bending ends of the lattice part and are embedded in the side wall parts of said resin molded body.

3. The electronic device according to claim 2, wherein said heat discharging member further comprises fixing parts extended from said leg parts and exposed to the outside of said resin molded body.

4. The electronic device according to claim 1, wherein said flat plate part in said resin molded body is plated with a metal film.

5. An electronic device comprising: a resin molded body having side wall parts and a flat plate part; a heat discharging member made of a metal which has a projection part projecting from said flat plate part and is embedded in said resin molded body; and a printed wiring board on which an electronic part is mounted and which is attached to the flat plate part of said resin molded body, wherein said electronic part is in contact with the projection part of said heat discharging member.

6. The electronic device according to claim 5, wherein said heat discharging member has a lattice part embedded in the flat plate part of said resin molded body and leg parts which are formed by bending ends of the lattice part and are embedded in the side wall parts of said resin molded body.

7. The electronic device according to claim 6, wherein said heat discharging member further comprises fixing parts which are extended from said leg parts and are exposed to the outside of said resin molded body.

8. The electronic device according to claim 5, wherein said flat plate part of said resin molded body is plated with a metal film.

* * * * *

UNITED STATES PATENT AND TRADEMARK OFFICE
CERTIFICATE OF CORRECTION

PATENT NO. : 6,097,600  Page 1 of 1
DATED : August 1, 2000
INVENTOR(S) : Yoshio Saito et al.

It is certified that error appears in the above-identified patent and that said Letters Patent is hereby corrected as shown below:

Claim 1,
Lines 10-11, change "is come" to -- comes --.

Signed and Sealed this

Nineteenth Day of March, 2002

Attest:

JAMES E. ROGAN
Attesting Officer     Director of the United States Patent and Trademark Office